United States Patent
Magrath

(10) Patent No.: US 7,508,331 B2
(45) Date of Patent: Mar. 24, 2009

(54) DIGITAL-TO-ANALOG CONVERTER WITH DYNAMIC ELEMENT MATCHING TO MINIMIZE MISMATCH ERROR

(75) Inventor: Anthony James Magrath, Edinburgh (GB)

(73) Assignee: Wolfson Microelectronics plc, Edinburgh (GB)

( * ) Notice: Subject to any disclaimer, the term of this patent is extended or adjusted under 35 U.S.C. 154(b) by 0 days.

(21) Appl. No.: 11/822,565

(22) Filed: Jul. 6, 2007

(65) Prior Publication Data
US 2008/0180292 A1    Jul. 31, 2008

(30) Foreign Application Priority Data
Jan. 31, 2007   (GB) .................................. 0701858

(51) Int. Cl.
*H03M 1/66*   (2006.01)
(52) U.S. Cl. ....................... 341/144; 341/143
(58) Field of Classification Search ................ 341/143, 341/144, 155, 200
See application file for complete search history.

(56) References Cited

U.S. PATENT DOCUMENTS

| | | | | |
|---|---|---|---|---|
| 6,150,970 A * | 11/2000 | Anagnos | ............... | 341/144 |
| 6,304,241 B1 * | 10/2001 | Udo et al. | ............... | 345/96 |
| 6,583,742 B1 | 6/2003 | Hossack | | |
| 2004/0032355 A1 | 2/2004 | Melanson et al. | | |
| 2007/0229337 A1 * | 10/2007 | Sanmiya et al. | ............ | 341/144 |

* cited by examiner

*Primary Examiner*—Peguy JeanPierre
(74) *Attorney, Agent, or Firm*—Dickstein Shapiro LLP

(57) ABSTRACT

In a dynamic element matching stage of a digital-to-analogue converter, in which a pair of quantizer outputs are generated, and are constrained such that their sum is equal to the parity of a received bit value, steps are taken to improve baseband noise performance. Each of the quantizers has a feedback loop associated with it, and the performance is improved by determining the quantizer outputs based on these loop values, in order to reduce the overall quantization noise. However, during time periods when these loop values are equal, there are two possible pairs of quantizer outputs that could be chosen, without adversely impacting on the overall quantization noise. the quantizer outputs are monitored during such time periods, and steps are taken to control the quantizer outputs during such time periods, in order to ensure that the two possible pairs of quantizer outputs are chosen with equal probability.

13 Claims, 7 Drawing Sheets

PRIOR ART

US 7,508,331 B2

DIGITAL-TO-ANALOG CONVERTER WITH DYNAMIC ELEMENT MATCHING TO MINIMIZE MISMATCH ERROR

BACKGROUND OF THE INVENTION

1. Field of the Invention

This invention relates to a digital-to-analog converter, and in particular to a digital-to-analog converter that attempts to reduce an amount of noise present in an output signal, and to a method of operation of a digital-to-analog converter.

2. Description of the Related Art

In many electronics devices, digital signals are used in order to allow signal processing operations to be performed, or to allow data to be stored in a convenient form. However, it is often necessary to use analog signals, for example to drive devices such as audio equipment. In such situations, and many others, digital-to-analog converters are used to convert a digital input signal to an analog output signal.

Digital-to-analog converters are known, in which a value of a digital input signal is used to select a number of single-bit digital-to-analog converter elements. The outputs of these single-bit digital-to-analog converter elements are then summed together, in order to produce an analog output signal.

U.S. Pat. No. 6,583,742 discloses a digital-to-analog converter, comprising:

a plurality of pairs of digital-to-analog converter elements; and an adder, connected to form an analog output signal as the sum of the outputs of the pairs of digital-to-analog converter elements; and further comprising:

an element matching circuit, connected to receive a digital input signal, and apply respective inputs to the pairs of digital-to-analog converter elements, wherein the element matching circuit comprises an element matching stage associated with each of the pairs of digital-to-analog converter elements, and wherein each element matching stage comprises:

an input for a respective stage remainder value, the remainder value having a parity determined by a value of a least significant bit thereof;

first and second quantizers, for forming a pair of quantizer outputs, a sum of said quantizer outputs being constrained to be equal to the parity of the remainder value; and first and second feedback loops, associated with the first and second quantizers respectively, for forming respective first and second loop values and applying said loop values as inputs to the first and second quantizers respectively.

In this prior art device, a small amount of random noise is added to the inputs of the first and second quantizers, in order to randomize the decisions taken by the quantizers, and thereby reduce the likelihood of repetitive patterns being generated in the output signals.

It is noted that the effect of this random noise in altering the state of the quantizers will be much greater when the absolute values of the inputs of the first and second quantizers are substantially equal.

SUMMARY OF THE INVENTION

According to a first aspect of the present invention, there is provided at least one integrator, for monitoring at least one of the quantizer outputs when said first and second loop values are substantially equal. This monitoring allows the quantization decisions to be taken in such a way that minimizes the error in the output signal.

According to a first aspect of the present invention, there is provided a digital-to-analog converter, comprising:

a plurality of pairs of digital-to-analog converter elements; and an adder, connected to form an analog output signal as the sum of the outputs of the pairs of digital-to-analog converter elements; and further comprising:

an element matching circuit, connected to receive a digital input signal, and apply respective inputs to the pairs of digital-to-analog converter elements, wherein the element matching circuit comprises a dynamic element matching stage associated with each of the pairs of digital-to-analog converter elements, and wherein each dynamic element matching stage comprises:

an input for a respective stage remainder value, the remainder value having a parity determined by a value of a least significant bit thereof;

first and second quantizers, for forming a pair of quantizer outputs, a sum of said quantizer outputs being constrained to be equal to the parity of the remainder value;

first and second feedback loops, associated with the first and second quantizers respectively, for forming respective first and second loop values and applying said loop values as inputs to the first and second quantizers respectively, and at least one integrator, for producing an output signal based on at least one of the quantizer outputs during time periods when said first and second loop values are substantially equal, wherein, during subsequent time periods when said first and second loop values are substantially equal, said quantizer outputs are controlled based on the output signal of the at least one integrator.

According to a second aspect of the present invention, there is provided a method of operation of a digital-to-analog converter, wherein the digital-to-analog converter comprises:

a plurality of pairs of digital-to-analog converter elements; and an adder, connected to form an analog output signal as the sum of the outputs of the pairs of digital-to-analog converter elements;

an element matching circuit, connected to receive a digital input signal, and apply respective inputs to the pairs of digital-to-analog converter elements, wherein the element matching circuit comprises a dynamic element matching stage associated with each of the pairs of digital-to-analog converter elements, and wherein each dynamic element matching stage comprises:

an input for a respective stage remainder value, the remainder value having a parity determined by a value of a least significant bit thereof;

first and second quantizers, for forming a pair of quantizer outputs;

first and second feedback loops, associated with the first and second quantizers respectively, for forming respective first and second loop values and applying said loop values as inputs to the first and second quantizers respectively, the method comprising, in at least one dynamic element matching stage:

producing an output signal based on at least one of the quantizer outputs during time periods when said first and second loop values are substantially equal; and during subsequent time periods when said first and second loop values are substantially equal, controlling said quantizer outputs based on the output signal of the at least one integrator, while a sum of said quantizer outputs is constrained to be equal to the parity of the respective stage remainder value.

According to a third aspect of the present invention, there is provided an audio device, comprising a digital-to-analog converter in accordance with the first aspect of the invention.

According to a fourth aspect of the present invention, there is provided an electronic device, including an audio device, and comprising a digital-to-analog converter in accordance with the first aspect of the invention.

According to a fifth aspect of the present invention, there is provided a computer-readable medium, comprising software code for implementing a digital-to-analog converter in accordance with the first aspect of the invention.

Embodiments of the invention may have the advantage that the baseband noise performance of the digital-to-analog converter is improved.

BRIEF DESCRIPTION OF THE DRAWINGS

For a better understanding of the present invention, and to show how it may be put into effect, reference will now be made, by way of example, to the accompanying drawings, in which.

DETAILED DESCRIPTION OF THE PREFERRED EMBODIMENTS

Figure 1:
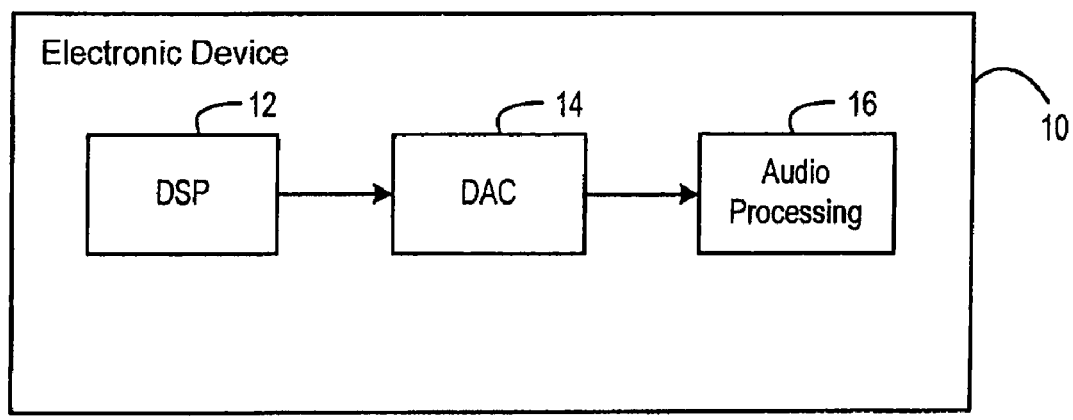
FIG. 1 is a schematic diagram, illustrating an electronic device in accordance with an aspect of the invention.

FIG. 1 is a block schematic diagram, illustrating the general form of an electronic device 10. For example, the device 10 may be an audio device, for example such as an audio reproduction device, a games machine, a DVD player, a personal computer, or the like.

Input digital data is supplied from a source (not shown) to a digital signal processor (DSP) 12, for performing a conventional digital signal processing operation on the digital data. The processed digital data is then supplied as an input signal to a digital-to-analog converter 14, for conversion into an analog form. The resulting analog signal is supplied to an audio processing device 16, which may for example be an audio amplifier.

It will be appreciated that this type of device is just one example of many devices where digital-to-analog converters are used.

Figure 2:
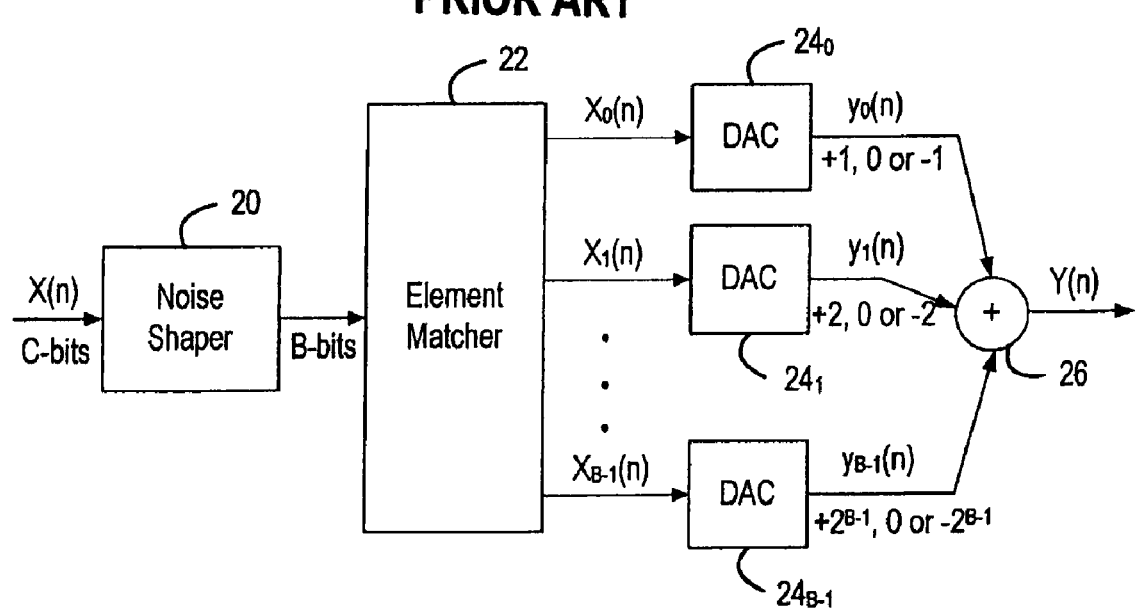
FIG. 2 is a block schematic diagram, showing a digital-to-analog converter, in accordance with an aspect of the present invention.

FIG. 2 is a block schematic diagram, illustrating the form of the digital-to-analog converter 14 in more detail. For each sample value, n, an input digital signal X(n), containing C bits in each sample value, is applied to a noise shaper 20, which reduces the length of each data word, from C bits to B bits in this illustrated case. This truncation reduces the complexity of the overall circuit, but runs the risk of introducing noise into the signal, and so, in order to reduce the amount of noise, the noise shaper 20 takes the form of a sigma-delta modulator (SDM) in this embodiment of the invention.

The truncated word length, B bits, may for example be in the range of 3 to 6 bits.

The reduced length digital signal is supplied as an input to a dynamic element matching block 22.

The dynamic element matching block 22 then supplies one-bit digital signals $X_0(n), X_1(n), \ldots, X_{B-1}(n)$ to each of B weighted digital-to-analog converters $24_0, 24_1, \ldots, 24_{B-1}$. The weighted digital-to-analog converters $24_0, 24_1, \ldots, 24_{B-1}$ produce respective analog outputs $y_0(n), y_1(n), \ldots, y_{B-1}(n)$.

In each case, the digital-to-analog converters $24_A$ produce an output $y_A(n)$ that can nominally be controlled to be $+2^A$, 0 or $-2^A$, where A is the stage number, in the range from 0 to (B−1).

However, one of the issues with a device of this type is that there is almost inevitably some degree of mismatch between the weighted digital-to-analog converters $24_0, 24_1, \ldots, 24_{B-1}$, causing them to produce analog outputs that do not have values exactly equal to those indicated above, and resulting in an increase in noise and distortion.

The digital-to-analog converters $24_0, 24_1, \ldots, 24_{B-1}$ can for example be switched-current elements, or switched-capacitor elements, or any other type of DAC element.

The analog outputs $y_0(n), y_1(n), \ldots, y_{B-1}(n)$ of the digital-to-analog converters $24_0, 24_1, \ldots, 24_{B-1}$ are applied to an adder 26 to form an analog output signal Y(n).

Figure 3:
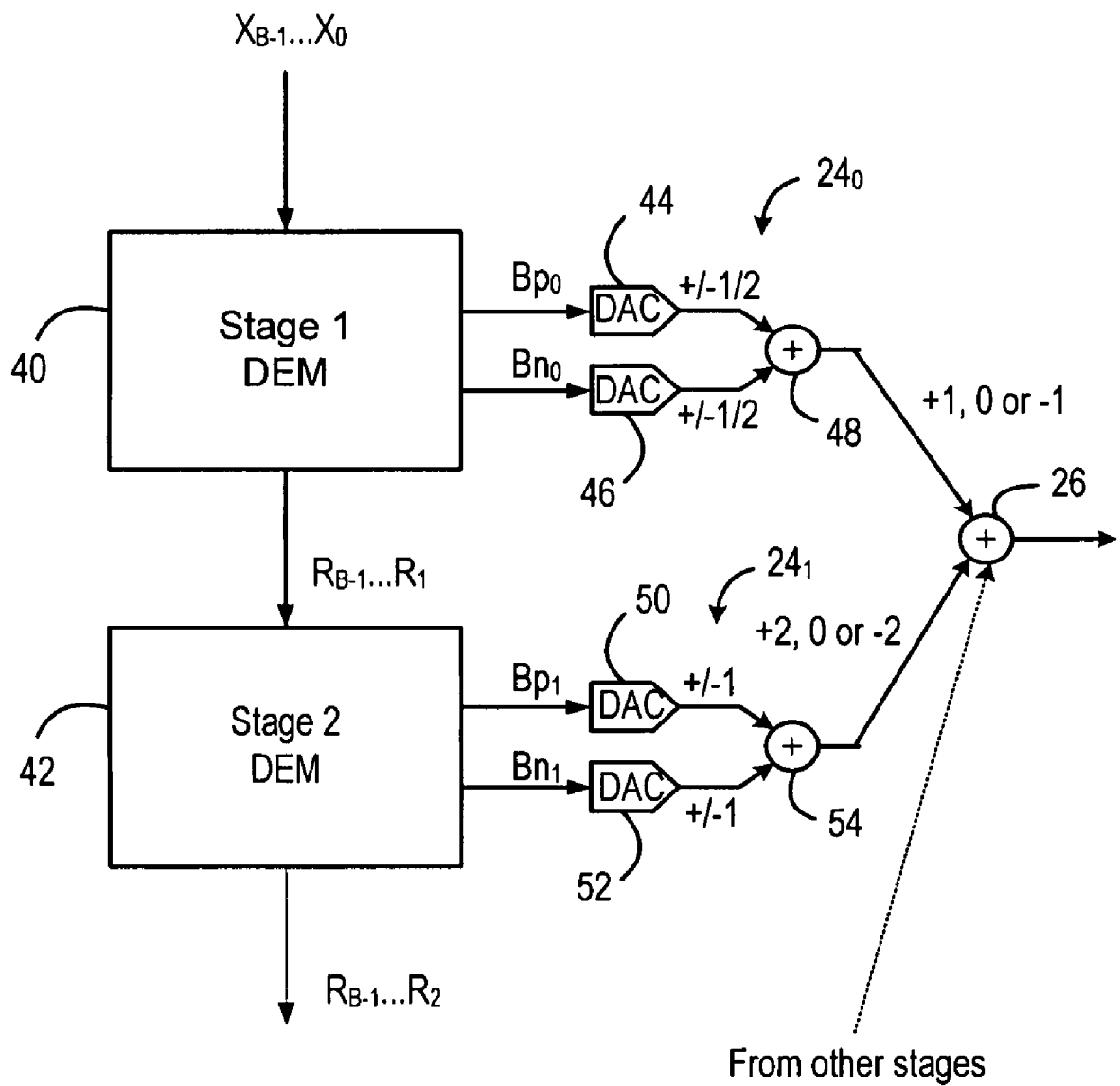
FIG. 3 illustrates in more detail a part of the digital-to-analog converter of FIG. 2.

The dynamic element matching (DEM) block 22 acts to reduce the distortion and noise, by minimising the mismatch error at low frequencies introduced by each of the digital-to-analog converter outputs. Since the mismatch error is reduced in each of the digital-to-analog converter outputs, the summed output will also have reduced error. As shown in FIG. 3, the DEM block 22 receives an input code from the noise shaper 20, the B bits of the input code being indicated as $X_{B-1} \ldots X_0$. The DEM block 22 comprises a sequence of stages, with a first stage 40 dealing with the LSB, $X_0$, the second stage 42 dealing with the second least significant bit of the input code and each successive stage dealing with the next successively significant bit.

As mentioned above, the digital-to-analog converters $24_0, 24_1, \ldots, 24_{B-1}$ are tri-level, with the first digital-to-analog converter $24_0$ outputting +1, 0 or −1, the second digital-to-analog converter $24_1$ outputting +2, 0 or −2, the third digital-to-analog converter $24_2$ outputting +4, 0, or −4, and so on up the chain.

The first tri-level digital-to-analog converter $24_0$ is implemented as a pair of 2-level digital-to-analog converters 44, 46, driven by respective inputs $Bp_0$ and $Bn_0$ from the first DEM stage 40, and with the outputs of these 2-level digital-to-analog converters 44, 46 summed together in an adder 48. When these outputs are both driven positive, the summed output is positive; when these outputs are both driven negative, the summed output is negative; and when these outputs are driven with opposite polarity the summed output is zero. This is shown in the table below for the stage 1 digital-to-analog converter $24_0$.

| DEM outputs | | combined DAC output |
|---|---|---|
| $Bp_n$ | $Bn_n$ | |
| +½ | −½ | 0 |
| −½ | +½ | 0 |
| +½ | +½ | +1 |
| −½ | −½ | −1 |

Similarly, the second tri-level digital-to-analog converter $24_1$ is implemented as a pair of 2-level digital-to-analog converters 50, 52, driven by respective inputs $Bp_1$ and $Bn_1$ from the second DEM stage 42, and with the outputs of these 2-level digital-to-analog converters 50, 52 summed together in an adder 54.

Each DEM stage has the function of choosing the output states $Bp_n$ and $Bn_n$, such that, when added together by the summation of the DAC outputs, they form a number which has the same parity (odd or even) as the LSB of the input to that stage. So an input code LSB of 1 can produce an output of +1 or −1 from the adder 48, and an LSB of 0 can produce an output of zero from the adder 48.

Within the relevant DEM stage 40, 42 etc, this result is then subtracted from the input, resulting in an even remainder which is passed up the chain. Thus, the first stage DEM 40 removes the LSB $X_0$ of the input code, producing an even remainder $R_{B-1} \ldots R_1$ that is passed to the second stage DEM 42, which in turn removes the next least significant bit to produce an even remainder $R_{B-1} \ldots R_2$ that is passed to the next stage, and so on. In this way, the DEM 22 successively peels off LSBs from the input code, producing an output pair which is fed to the DAC pairs, and leaving a remainder which is passed to the remaining DEM stages.

Figure 4:
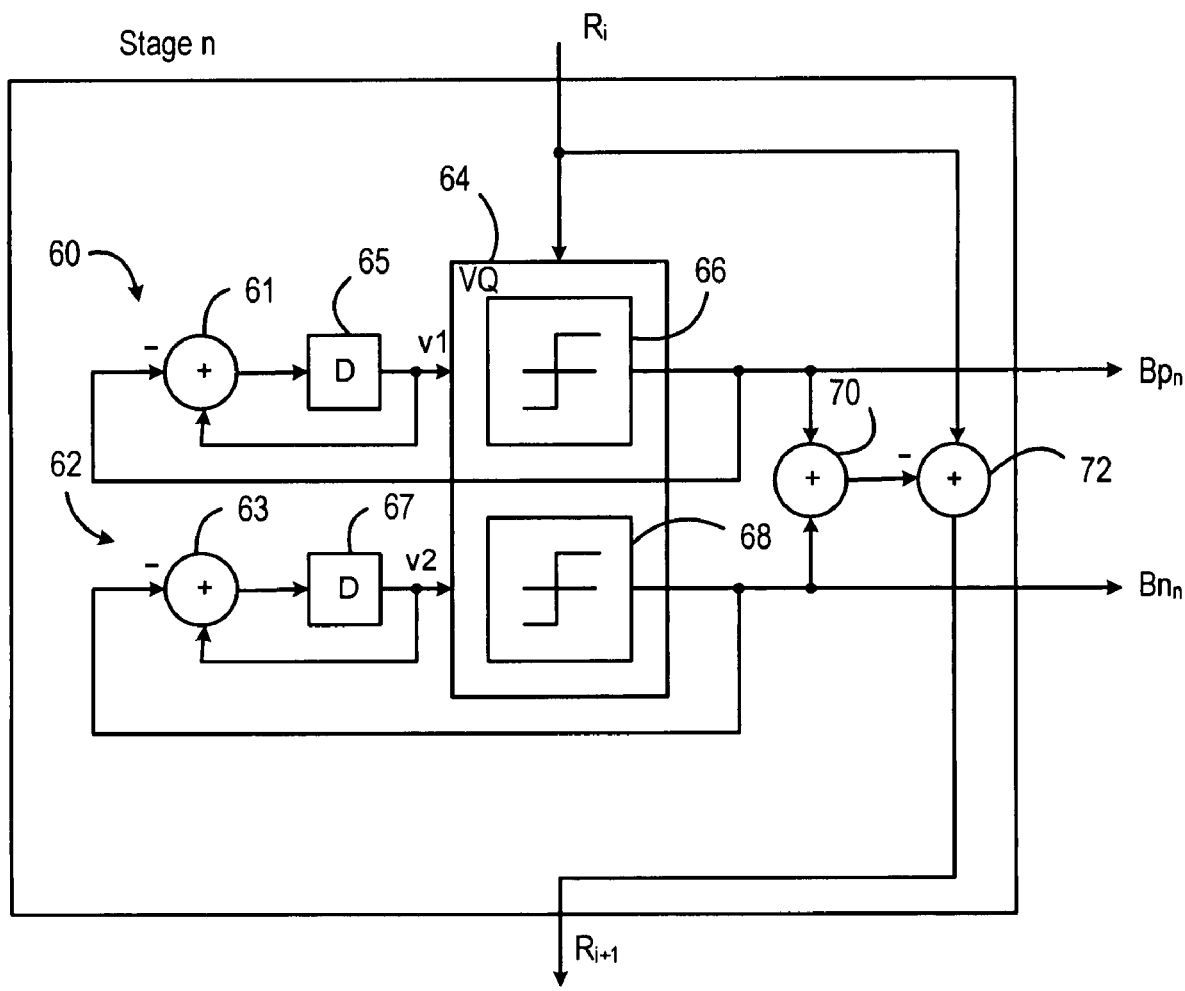
FIG. 4 is provided for explaining the operation of a part of the circuit shown in FIG. 3.

FIG. 4 illustrates the operation of one of the DEM stages, identified here as the nth stage, receiving the input code, or remainder value $R_i$. Two sigma-delta modulators (SDMs) 60, 62 share a Vector Quantizer (VQ) 64, which performs the function of quantizers 66, 68 in the respective SDMs 60, 62. The VQ also receives the input code, or remainder value $R_i$, as an input. The sigma-delta modulators 60, 62 include respective input adders 61, 63 and delay elements 65, 67. It should be noted that there are no input signals fed into the input adders 61, 63, unlike in some SDMs. Thus, in this special case, the inputs to the delay elements 65, 67 are the quantization errors generated by the respective quantizers 66, 68.

The first sigma-delta modulator 60 provides a first loop input v1 to the Vector Quantizer 64, while the second sigma-delta modulator 62 provides a second loop input v2 to the Vector Quantizer 64. The first sigma-delta modulator 60 provides a first output $Bp_n$ to a first of the associated pair of digital-to-analog converters, while the second sigma-delta modulator 62 provides a second output $Bn_n$ to a second of the associated pair of digital-to-analog converters.

These outputs $Bp_n$, $Bn_n$ are also supplied to an adder 70 to form their sum, and this is subtracted from the input code, or remainder value $R_i$, in a second adder 72 to form a new remainder value $R_{i+1}$, which is supplied to the next stage DEM.

For each possible value of $R_i$, there are two possible output states from each quantizer, which when summed have the same parity as the input, as shown below.

| $R_i$ | $Bp_n$ | $Bn_n$ | $Bp_n + Bn_n$ |
|---|---|---|---|
| 0 (even parity) | +½ | −½ | 0 |
|  | −½ | +½ | 0 |
| 1 (odd parity) | +½ | +½ | 1 |
|  | −½ | −½ | −1 |

When $R_n=0$, the value $Bp_n+Bn_n=0$ is subtracted from $R_n$, leaving the LSB unchanged with a value of zero, allowing it to be discarded.

When $R_n=1$, the value $Bp_n+Bn_n$ can be either +1 or −1. If $Bp_n+Bn_n=1$, the value 1 is subtracted from $R_n$, resulting in $R_n=0$. If $Bp_n+Bn_n-1$, the value −1 is subtracted from $R_n$ resulting in $R_n=0$ and a carry being added to the input code.

The choice between the possible output values is made by the Vector Quantizer 64 so as to minimise the quantizer errors in the SDM. For a single SDM, the quantizer error is minimised if the sign of each quantizer output matches the sign of the respective quantizer input, that is, the loop input v1 for the first quantizer 66 and the loop input v2 for the second quantizer 68.

However, as the quantizers are coupled, the error minimisation requirements of each loop may conflict. That is, the quantizer state required to minimise the error in both loops may not result in the input signal being correctly represented in the outputs. For example, if $R_i=0$ only one of $Bp_n$ or $Bn_n$ can be positive, even if both v1 and v2 are positive. The solution is always to set the quantizer output which has the largest input magnitude (i.e. the largest absolute value) to be positive, as this will result in the smallest total quantization error. The resulting decision logic is described in the following table.

| $R_i$ | Condition | $Bp_n$ | $Bn_n$ |
|---|---|---|---|
| 0 (even) | v1 > v2 | +½ | −½ |
|  | v1 <= v2 | −½ | +½ |
| 1 (odd) | v1 > −v2 | +½ | +½ |
|  | v1 <= −v2 | −½ | −½ |

Each of the sigma-delta modulators 60, 62 has a zero input, since there is no input signal fed into the input adders 61, 63, and therefore forces the average output to be zero.

First-order SDMs tend to produce a strong limit cycle at FS/2, meaning that the output oscillates between the two states in the shortest possible time. This means that the pairs of elements which are being matched are switched between at the highest possible frequency. This causes the mismatch error between the elements to be pushed to high frequencies, thus minimising the error at low frequencies. However, due to the limit cycling behaviour of the SDMs, tones can occur in the audio band for particular DC inputs. The solution to this problem, as described in U.S. Pat. No. 6,583,742, is to dither the SDMs by adding a small amount of random noise at the quantizer inputs.

When dither is added to the quantizer inputs, it will have a much greater influence on the decision of the VQ when v1 and v2 have similar absolute values. In fact results have shown that adequate linearisation (removal of tones) occurs when the dither is of a low enough level to cause the state of the quantizer outputs to change only during the conditions where v1=v2 or v1=−v2. In the following, these conditions will be referred to as the Equality Conditions. During these conditions, v1 and v2 have equal absolute values, and the quantization error is the same, regardless of the choice, as shown in the following table.

| $R_i$ | Condition | $Bp_n$ | $Bn_n$ |
|---|---|---|---|
| 0 (even) | v1 > v2 | +½ | −½ |
|  | v1 < v2 | −½ | +½ |
|  | v1 = v2 | +½ | −½ |
|  |  | or |  |
|  |  | −½ | +½ |
| 1 (odd) | v1 > −v2 | +½ | +½ |
|  | v1 < −v2 | −½ | −½ |
|  | v1 = −v2 | +½ | +½ |
|  |  | or |  |
|  |  | −½ | −½ |

When dither is applied, although the choice is randomised, there is no guarantee that the two output states will repeat with the highest possible frequency, since the choice depends on the statistical properties of the dither (e.g. its low frequency wander). Therefore the ability of the DEM to minimise the mismatch error at low frequencies is compromised when dither is applied.

In embodiments of the invention, therefore, the mismatch error in the baseband is minimised not by applying dither but, instead, by improving the decision process during the Equality Conditions, namely by minimising the mismatch error at low frequencies, whilst pseudo-randomly influencing the choice of the VQ.

Figure 5:
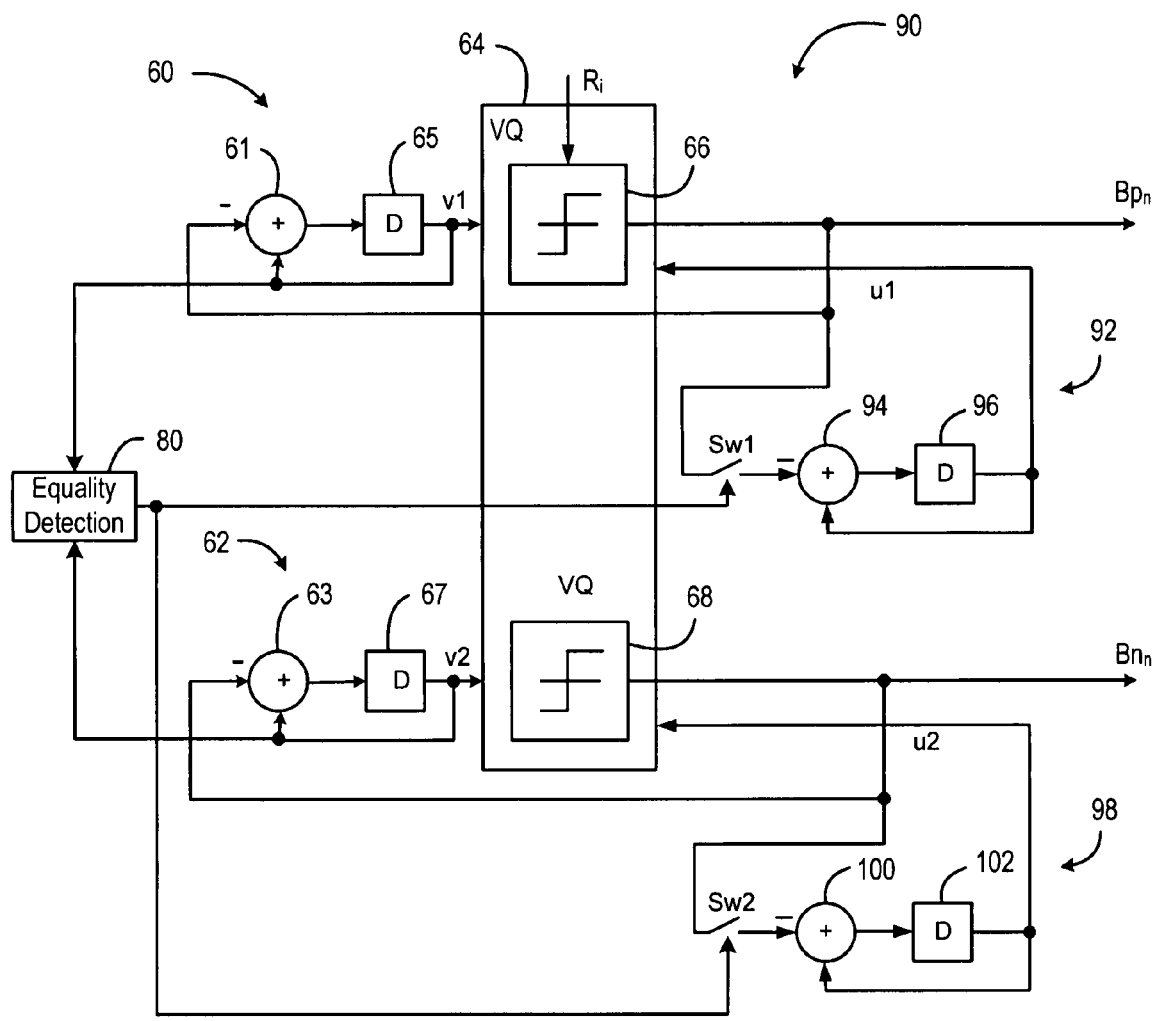
FIG. 5 illustrates a matching stage in the circuit of FIG. 3, in accordance with an aspect of the invention.

FIG. 5 illustrates the DEM stage 90 according to one embodiment of the invention. Features of the DEM stage 90 corresponding to those shown in FIG. 4 are indicated by the same reference numerals, and will not be described further. As in FIG. 4, the outputs $Bp_n$ and $Bn_n$ are added together, with their sum being subtracted from the input value or current remainder value, but these adders are omitted from FIG. 5 for clarity.

According to this embodiment, steps are taken to ensure that the VQ 64 chooses the output states equally and that the states are alternately chosen with the highest possible frequency.

Figure 6:
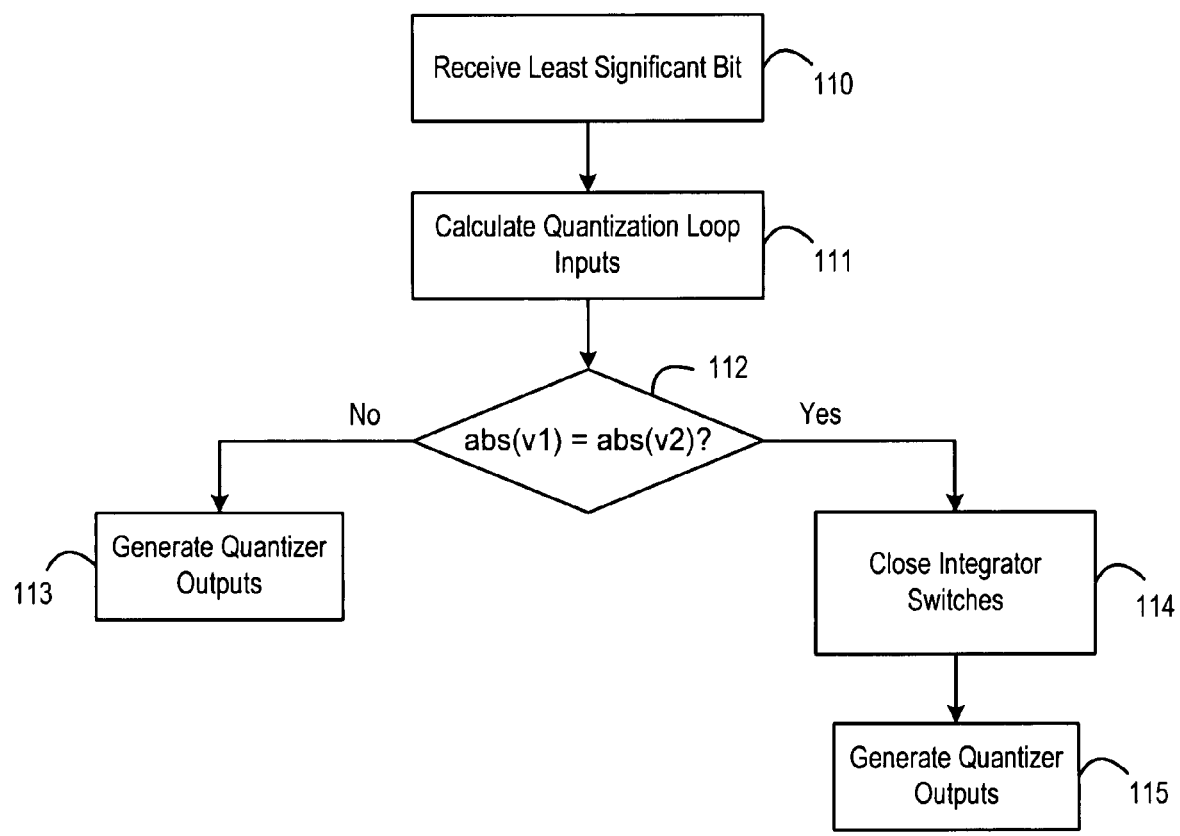
FIG. 6 is a flow chart, illustrating a method in accordance with the present invention.

FIG. 6 is a flow chart, illustrating the method performed by the DEM stage 90 in this embodiment. In step 110, the least significant bit $R_i$ is received and, in step 111, the quantization loop inputs v1 and v2 are calculated.

Then, in step 112 of the process, the current values of v1 and v2 are supplied to equality detection circuitry 80, which detects when v1=v2 or v1=−v2, that is, when one of the Equality Conditions applies. If it is determined in step 112 that the Equality Conditions do not apply, the process passes to step 113, and the quantizer outputs $Bp_n$ and $Bn_n$ are generated as described above, in order to minimize the quantization error, while satisfying the requirement that the sum of the quantizer outputs should have the same parity as the least significant bit $R_i$.

If it is determined in step 112 that one of the Equality Conditions applies, the process passes to step 114.

In step 114, an output signal from the equality detection circuitry 80 is applied to switches Sw1 and Sw2, such that, when one of the Equality Conditions is detected, the switches Sw1 and Sw2 are closed. A first integrator 92, including an adder 94 and a delay element 96, then finds the sum of the quantizer outputs generated by the first quantizer 66 (that is, whether the quantizer 66 has produced a greater number of positive or negative output states) during time periods when the switch Sw1 was closed, while a second integrator 98, including an adder 100 and a delay element 102, finds the sum of the outputs generated by the second quantizer 68 (that is, whether the quantizer 68 has produced a greater number of positive or negative output states) during time periods when the switch Sw2 was closed.

Due to the minus signs at the inputs to the adders 94, 100 of the integrators 92, 98, when one of the integrator outputs u1, u2 is positive it implies that a greater number of negative than positive output states have been produced by the respective quantizer, and therefore the correct decision is to produce a positive quantizer output. Similarly, when one of the integrator outputs u1, u2 is negative, it implies that a greater number of positive than negative output states have been produced by the respective quantizer, and therefore the correct decision is to produce a negative quantizer output.

Ideally then, during an Equality Condition, the sign of each quantizer output should be made equal to the sign of the respective integrator output. However the quantizer output states are still constrained to respond correctly to the input signal $R_i$. Therefore, as before, a conflict can occur between the two requirements. As before the conflict is resolved by choosing the VQ state which minimises the overall quantizer error. This corresponds to choosing the quantizer where the associated equality integrator 92, 98 has the largest output magnitude. This is summarised in the following table.

| $R_i$ | Condition | $Bp_n$ | $Bn_n$ |
|---|---|---|---|
| 0 (even) | v1 > v2 | +½ | −½ |
| | v1 < v2 | −½ | +½ |
| | v1 = v2 AND u1 > u2 | +½ | −½ |
| | v1 = v2 AND u1 <= u2 | −½ | +½ |
| 1 (odd) | v1 > −v2 | +½ | +½ |
| | v1 < −v2 | −½ | −½ |
| | v1 = −v2 AND u1 > −u2 | +½ | +½ |
| | v1 = −v2 AND u1 <= −u2 | −½ | −½ |

Thus, in step 115, the appropriate quantizer outputs are generated.

As a further embellishment, it is noted that there are an additional two Equality Conditions, when u1 and u2 have the same magnitude. It is possible to extend the idea to incorporate additional integrators to count the quantizer output states and influence the decision of the VQ accordingly.

Figure 7:
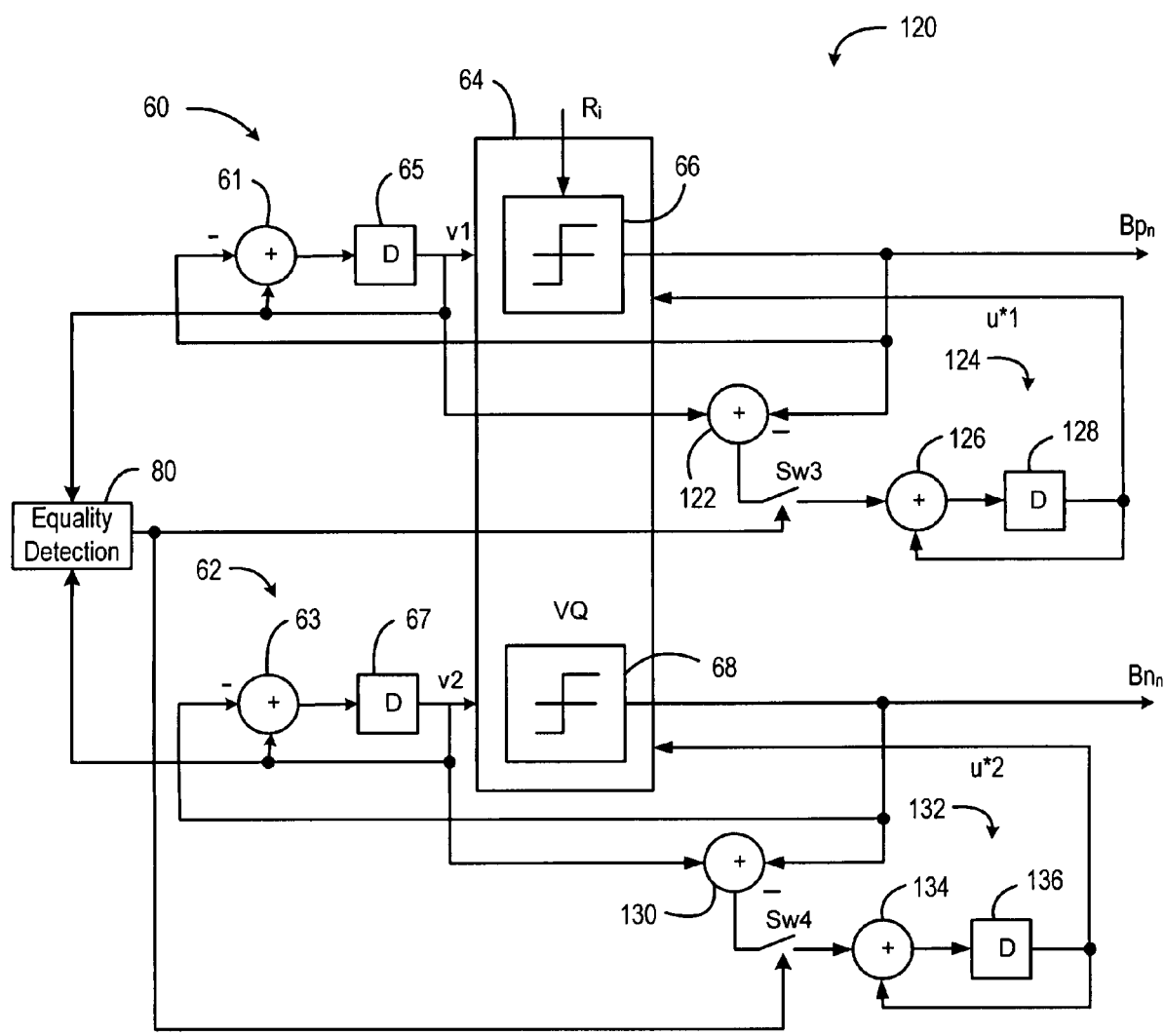
FIG. 7 illustrates a matching stage in the circuit of FIG. 3, in accordance with another aspect of the invention.

FIG. 7 illustrates the DEM stage 120 according to another embodiment of the invention. Features of the DEM stage 120 corresponding to those shown in FIG. 4 are indicated by the same reference numerals, and will not be described further. As in FIG. 4, the outputs $Bp_n$ and $Bn_n$ are added together, with their sum being subtracted from the input value or current remainder value, but these adders are omitted from FIG. 7 for clarity.

The embodiment illustrated in FIG. 7 attempts to ensure that the decision process minimises the overall quantization error in the loop, and so the quantization error is measured for samples where there is an Equality Condition, and the VQ output states are chosen to minimise this error.

Figure 8:
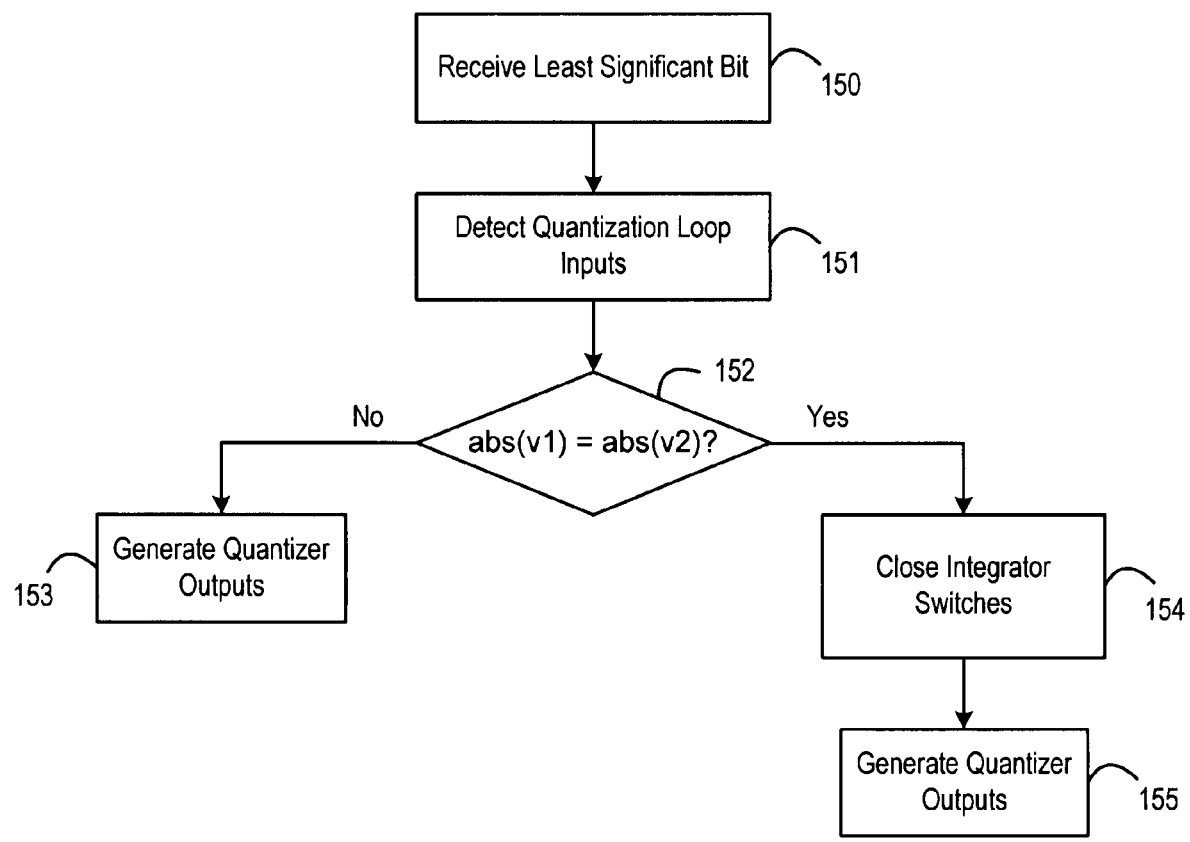
FIG. 8 is a flow chart, illustrating another method in accordance with the present invention.

FIG. 8 is a flow chart, illustrating the method performed by the DEM stage 120 in this embodiment. In step 150, the least significant bit $R_i$ is received and, in step 151, the quantization loop inputs v1 and v2 are calculated.

Then, in step 152 of the process, the current values of v1 and v2 are supplied to equality detection circuitry 80, which detects when v1=v2 or v1=−v2, that is, when one of the Equality Conditions applies. If it is determined in step 152 that the Equality Conditions do not apply, the process passes to step 153, and the quantizer outputs $Bp_n$ and $Bn_n$ are generated as described above, in order to minimize the quantization error, while satisfying the requirement that the sum of the quantizer outputs should have the same parity as the least significant bit $R_i$.

If it is determined in step 152 that one of the Equality Conditions applies, the process passes to step 154, and an output signal from the equality detection circuitry 80 is then applied to switches Sw3 and Sw4, such that, when one of the Equality Conditions is detected, the switches Sw3 and Sw4 are closed.

The output $Bp_n$ of the quantizer 66 is subtracted from the input v1 in an adder 122 to determine the quantization error. When one of the Equality Conditions is detected, the switch Sw3 is closed, and a first integrator 124, including an adder 126 and a delay element 128, then accumulates the error values generated during time periods when the switch Sw3 was closed, in order to monitor whether a net positive or negative error has occurred, and a corresponding output u*1 is generated.

Similarly, the output $Bn_n$ of the quantizer 68 is subtracted from the input v2 in an adder 130 to determine the quantization error. When one of the Equality Conditions is detected, the switch Sw4 is closed, and a second integrator 132, including an adder 134 and a delay element 136, then accumulates the error values generated during time periods when the switch Sw4 was closed, in order to monitor whether a net positive or negative error has occurred, and a corresponding output u*2 is generated.

It can be noted that the adders 122, 130 perform the same functions as the adders 61, 63 respectively and so, in practice, the adders 122, 130 can be eliminated and the outputs of the adders 61, 63 used instead.

The operation of the vector quantizer 64 is then modified to take account of the additional inputs u*1 and u*2. As before, the sign of the outputs is constrained by the input $R_i$. That is, when $R_i=0$, the outputs must have opposite signs, and when $R_i=1$, the outputs must have the same signs. The total error is therefore minimised using the same conditions for u*1 and u*2 as for v1 and v2, as shown in the following table.

| $R_i$ | Condition | $Bp_n$ | $Bn_n$ |
|---|---|---|---|
| 0 (even) | v1 > v2 | +½ | −½ |
|  | v1 < v2 | −½ | +½ |
|  | v1 = v2 AND u*1 > u*2 | +½ | −½ |
|  | v1 = v2 AND u*1 <= u*2 | −½ | +½ |
| 1 (odd) | v1 > −v2 | +½ | +½ |
|  | v1 < −v2 | −½ | −½ |
|  | v1 = −v2 AND u*1 > −u*2 | +½ | +½ |
|  | v1 = −v2 AND u*1 <= −u*2 | −½ | −½ |

Thus, in step 115, the appropriate quantizer outputs are generated.

As described with reference to the embodiment shown in FIG. 5, the idea can be extended to have one or more additional stages of integrators to minimise the error when u*1 and u*2 have the same magnitude.

There are therefore described analog-to-digital converters that have low levels of baseband noise and distortion.

The skilled person will recognize that the above-described apparatus and methods may be embodied as processor control code, for example on a carrier medium such as a disk, CD- or DVD-ROM, programmed memory such as read only memory (Firmware), or on a data carrier such as an optical or electrical signal carrier. For many applications, embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re-)programmable analog array or similar device in order to configure analog hardware.

The invention claimed is:

1. A digital-to-analogue converter, comprising:
   a plurality of pairs of digital-to-analogue converter elements; and
   an adder, connected to form an analogue output signal as the sum of the outputs of the pairs of digital-to-analogue converter elements; and further comprising:
   an element matching circuit, connected to receive a digital input signal, and apply respective inputs to the pairs of digital-to-analogue converter elements, wherein the element matching circuit comprises a dynamic element matching stage associated with each of the pairs of digital-to-analogue converter elements, and wherein each dynamic element matching stage comprises:
   an input for a respective stage remainder value, the remainder value having a parity determined by a value of a least significant bit thereof;
   first and second quantizers, for forming a pair of quantizer outputs, a sum of said quantizer outputs being constrained to be equal to the parity of the remainder value;
   first and second feedback loops, associated with the first and second quantizers respectively, for forming respective first and second loop values and applying said loop values as inputs to the first and second quantizers respectively, and
   at least one integrator, for producing an output signal based on at least one of the quantizer outputs during time periods when said first and second loop values are substantially equal, wherein, during subsequent time periods when said first and second loop values are substantially equal, said quantizer outputs are controlled based on the output signal of the at least one integrator.

2. A digital-to-analogue converter as claimed in claim 1, wherein the at least one integrator produces an output signal based on the numbers of positive and negative quantizer output values during time periods when said first and second loop values are substantially equal, and wherein the quantizers are controlled to produce quantizer outputs having substantially equal numbers of positive and negative values.

3. A digital-to-analogue converter as claimed in claim 2, comprising:
   a first integrator, for counting a difference between a number of outputs of the first quantizer produced with positive values and a number of outputs of the first quantizer produced with negative values, during time periods when said first and second loop values are substantially equal; and
   a second integrator, for counting a difference between a number of outputs of the second quantizer produced with positive values and a number of outputs of the second quantizer produced with negative values, during time periods when said first and second loop values are substantially equal.

4. A digital-to-analogue converter as claimed in claim 1, wherein the at least one integrator produces an output signal based on quantizer error values during time periods when said first and second loop values are substantially equal, and wherein, when said first and second loop values are substantially equal, a quantization error is measured, and the quantizers are controlled to minimize said quantization error.

5. A digital-to-analogue converter as claimed in claim 4, wherein said at least one integrator forms an integrated value of a difference between a quantizer output and a quantizer input for one of said quantizers.

6. An audio device, comprising a digital-to-analogue converter as claimed in claim 1.

7. An electronic device, including an audio device, and comprising a digital-to-analogue converter as claimed in claim 1.

8. A computer-readable medium, comprising software code for implementing a digital-to-analogue converter as claimed in claim 1.

9. A method of operation of a digital-to-analogue converter, wherein the digital-to-analogue converter comprises:
a plurality of pairs of digital-to-analogue converter elements; and
an adder, connected to form an analogue output signal as the sum of the outputs of the pairs of digital-to-analogue converter elements;
an element matching circuit, connected to receive a digital input signal, and apply respective inputs to the pairs of digital-to-analogue converter elements, wherein the element matching circuit comprises a dynamic element matching stage associated with each of the pairs of digital-to-analogue converter elements, and wherein each dynamic element matching stage comprises:
an input for a respective stage remainder value, the remainder value having a parity determined by a value of a least significant bit thereof;
first and second quantizers, for forming a pair of quantizer outputs;
first and second feedback loops, associated with the first and second quantizers respectively, for forming respective first and second loop values and applying said loop values as inputs to the first and second quantizers respectively,
the method comprising, in at least one dynamic element matching stage:
producing an output signal based on at least one of the quantizer outputs during time periods when said first and second loop values are substantially equal; and
during subsequent time periods when said first and second loop values are substantially equal, controlling said quantizer outputs based on said output signal, while a sum of said quantizer outputs is constrained to be equal to the parity of the respective stage remainder value.

10. A method as claimed in claim 9, further comprising, when said first and second loop values are substantially equal, controlling the quantizers to produce quantizer outputs having substantially equal numbers of positive and negative values.

11. A method as claimed in claim 10, further comprising:
counting a difference between a number of outputs of the first quantizer produced with positive values and a number of outputs of the first quantizer produced with negative values, during time periods when said first and second loop values are substantially equal; and
counting a difference between a number of outputs of the second quantizer produced with positive values and a number of outputs of the second quantizer produced with negative values, during time periods when said first and second loop values are substantially equal.

12. A method as claimed in claim 9, further comprising, when said first and second loop values are substantially equal:
measuring a quantization error;
accumulating the measured quantization errors; and
controlling the quantizers to minimize said accumulated quantization error.

13. A method as claimed in claim 12, wherein the step of measuring the quantization error comprises forming an integrated value of a difference between a quantizer output and a quantizer input for one of said quantizers.

* * * * *